United States Patent [19]
Holte

[11] Patent Number: 4,777,226
[45] Date of Patent: Oct. 11, 1988

[54] TERPOLYMER FROM (1) A POLY(VINYLBENZYLETHER) OF A POLYPHENOL (2) A CYANATE ESTER OF A POLYPHENOL AND (3) ALKENYL ARYL COMPOUND

[75] Inventor: Mark D. Holte, La Crosse, Wis.

[73] Assignee: Allied Corporation, Morris Township, Morris County, N.J.

[21] Appl. No.: 873,644

[22] Filed: Jun. 12, 1986

[51] Int. Cl.$^4$ ............... C08G 83/00; C08G 75/00; C08F 28/00

[52] U.S. Cl. .................... 525/534; 528/205; 528/211

[58] Field of Search ............ 528/205; 525/534

[56] References Cited

U.S. PATENT DOCUMENTS 4,116,946  9/1978  Jakob et al. ............. 528/205
4,665,154  5/1987  Varnell et al. ............ 528/205

Primary Examiner—John Kight
Assistant Examiner—Frederick Krass
Attorney, Agent, or Firm—Raymond H. Nelson; Harold N. Wells; Jay P. Friedenson

[57] ABSTRACT

Homogeneous thermoset terpolymers which may be used in the preparation of laminates for circuitry boards will comprise a poly(vinyl benzyl ether) of a polyphenol, a dicyanate ester of a polyether of a polyphenol and an alkenyl aryl compound. The polymers are prepared by admixing a solution of the poly(vinyl benzyl ether) of a polyphenol and an alkenyl aryl compound with a second solution of the dicyanate ester of a polyether of a polyphenol and the alkenyl aryl compound at elevated temperatures. The resulting terpolymer will possess desirable characteristics such as high glass transition temperature and low dielectric constant.

24 Claims, No Drawings

TERPOLYMER FROM (1) A POLY(VINYLBENZYLETHER) OF A POLYPHENOL (2) A CYANATE ESTER OF A POLYPHENOL AND (3) ALKENYL ARYL COMPOUND

BACKGROUND OF THE INVENTION

With the advent of sophisticated equipment in the electrical and electronic fields, it has become necessary that the components of the various pieces of equipment conform to high standards which are set forth in the specifications for these components. For example, circuit boards which are used in relatively complicated pieces of equipment such as main frame computers, must be of a relatively high standard of quality in order to function in an efficient manner for a long period of time without deteriorating or breaking down, and thus causing an interruption in the function of the machine. This high quality of material is opposed to pieces of equipment requiring a lower standard of quality such as those used in personal computers, high quality television equipment, radios, etc.

Circuit boards upon which a circuit is etched or implanted usually comprise a laminate which is composed of a synthetic polymeric substance which possesses desirable characteristics such as thermal stability, low coefficient of thermal expansion, dimensional stability, low dielectric constant, solvent resistance, low moisture absorption, etc. and a suitable reinforcement matrix, such as glass, quartz, graphite, Kevlar, etc.

As will hereinafter be shown, it has now been discovered that a homogeneous thermoset terpolymer of a poly(vinyl benzyl ether) of a polyphenol, a cyanate ester of a polyether of a polyphenol, and an alkenyl aryl compound may be used in the preparation of laminates which themselves will form a component of a circuit board and will possess the desirable characteristics hereinbefore set forth.

BRIEF SUMMARY OF THE INVENTION

This invention relates to homogeneous thermoset terpolymers. More specifically, the invention is concerned with novel high temperature homogeneous thermoset terpolymers and to a method for the preparation thereof. As was previously mentioned, the homogeneous thermoset terpolymers of the present invention, which constitute novel compositions of matter, may be used to coat and/or impregnate a substrate which is thereafter cured and utilized in circuit board laminates and dielectric coatings, the use thereof being attributable to the desirable characteristics which are possessed by these polymeric compositions of matter. The particular characteristics of the polymer dielectric and reinforcing components which go to make up the circuit boards contribute to the efficiency and stability of the final electronic equipment in which the circuit boards are used. For example, a lowering of the dielectric constant in the polymer matrix reduces the signal delay time or "crosstalk" and line capacitance. This results in faster PWB circuitry and, in addition, provides the potential to increase the number of functions per board. The polymeric matrix of the present invention possesses a lower dielectric constant than that which is possessed by thermosetting polyimide or epoxy matrices which are used as the standards by the industry for electrical laminates.

Another desirable characteristic of a polymer matrix for use in circuit boards is that the coefficient of thermal expansion should be relatively low in order to avoid a mismatch of thermal expansions with the electronic components and the fiberglass reinforcement with which the polymeric matrix is composited. The coefficient of expansion of the novel homogeneous thermoset terpolymers of the present invention may be comparable to a polyimide matrix. Furthermore, the thermal stability of the polymer matrix must be relatively high in nature inasmuch as the matrix must possess the ability to withstand soldering temperatures without melting or degrading. A desirable characteristic of the homogeneous thermoset terpolymer of the present invention is that the thermal stability of the polymer is comparable to a polyimide matrix.

In addition, by varying the ratio of the three components of the terpolymer, it is possible to provide a wide range of properties which will meet various and specific circuit board requirements. Furthermore, it is also possible, by preparing the terpolymers in a manner hereinafter set forth in greater detail, to provide a terpolymer which will meet the requirement for chip encapsulation, potting materials and metal foil coatings.

It is therefore an object of this invention to provide novel homogeneous thermoset terpolymers.

Another object of this invention is to provide a method for preparing the aforesaid homogeneous thermoset terpolymers which are useful as a component in the formulation of circuit board laminates.

In one aspect an embodiment of this invention resides in homogeneous thermoset terpolymers comprising (a) a poly(vinyl benzyl ether) of a polyphenol having the structure:

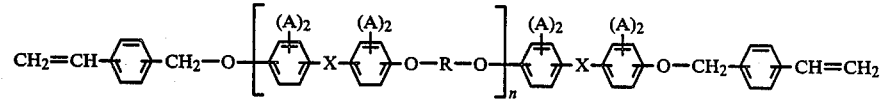

in which X is selected from the group consisting of

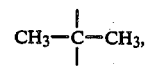

$SO_2$, O, S, and $CH_2$ radicals, R is selected from the group consisting of $-CH_2-C_6H_4-CH_2-$, $(CH_2)_b$ in which b ranges from 1 to about 6, $-CH_2-CH=CH-CH_2-$, $-CH_2-CH\equiv C-CH_2-$, $-CH_2-C_6H_3(A)_2-CH(OY)-CH_2-CH(CH_2OY)-C_6H_3(A)_2-CH_2-$, $-N=CH-O-C_6H_5-(CH_3)_2-C_6H_5-O-CH=N-$, $-C(NH)-O-C_6H_5-C(CH_3)_2-C_6H_5-O-C(NH)-$, $-C_6H_5-CH(OY)-CH_2-CH(M)-CH_2-CH(CH_2OY)-C_6H_5-$, $-CH_2-CH(OH)-CH_2-O-C_6H_5-C(CH_3)_2-C_6H_5-O-CH_2-CH(OH)-CH_2-$, and $CH_2-CH(OH)-CH_2-O-C_6H_3Br_2-C(CH_3)_2-C_6H_3Br_2-O-CH_2-CH(OH)-CH_2-$ radicals, where M is $-C_6H_5$, $-C_6H_4(CH_3)$, or $-C_6H_4(CH=CH_2)$ radical and Y is $C_6H_4OH$, A is independently selected from the group consisting of hydrogen, chlorine, bromine, fluorine, alkyl, alkoxy and phenyl radicals and n has an average value in the range of from about 0 to about 20 and (b) a dicyanate ester of a polyether of a polyphenol having the structure:

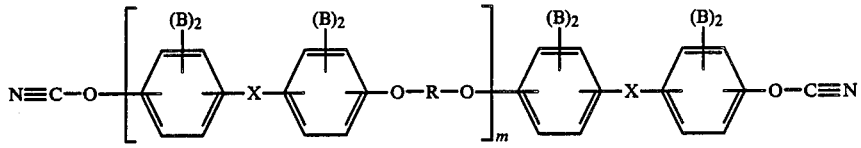

in which X is selected from the group consisting of

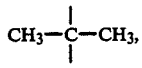

$SO_2$, O, S, and $CH_2$ radicals, R is selected from the group consisting of $-CH_2-C_6-H_4-CH_2-$, $(CH_2)_b$ in which b ranges from 1 to about 6, $-CH_2-CH=CH-CH_2-$, $-CH_2-C\equiv C-CH_2-$,

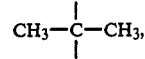

$SO_2$, O, S, and $CH_2$ radicals, R is selected from the group consisting of $-CH_2C_6H_4-CH_2-$, $(CH_2)_b$ in which b ranges from 1 to about 6, $-CH_2-CH=CH-CH_2-$, $-CH_2-C\equiv C-CH_2-$, $-CH_2-C_6H_3(A)_2-CH(OY)-CH_2-CH(CH_2OY)-C_6H_3(A)_2-CH_2-$, $-N=CH-O-C_6H_5-C(CH_3)_2-C_6H_5-O-CH=N-$, $-C(NH)-O-C_6H_5-C(CH_3)_2-C_6H_5-O-C(NH)-$, $-C_6H_5-CH(OY)-CH_2-CH(M)-CH_2-CH(CH_2OY)-C_6H_5-$, $-CH_2-CH(OH)-CH_2-O-C_6H_5-C(CH_3)_2-C_6H_5-O-CH_2-CH(OH)-CH_2-$, and $CH_2-CH(OH$

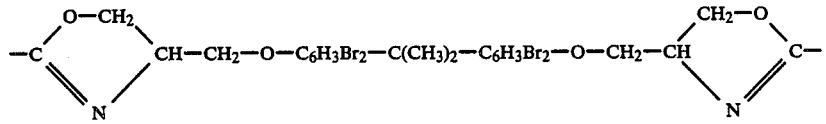

and:

radicals, B independently selected from the group consisting of hydrogen, chlorine, bromine, fluorine, alkyl, alkoxy and phenyl radicals and m has an average value in the range of from about 0 to about 20 and (c) an alkenyl aryl compound.

Another embodiment of this invention is found in a process for the production of a homogeneous thermoset terpolymer which comprises reacting a blend of (a) poly(vinyl benzyl ether) of a polyphenol having the structure:

$)-CH_2O-C_6H_3Br_2-C(CH_3)_2-C_6H_3Br_2-O-CH_2-CH(OH)-CH_2-$, radicals, where M is a $-C_6H_5$, $-C_6H_4(CH_3)$, or $-C_6H_4(CH=CH_2)$ radical and Y $C_6H_4OH$ quinone, A is independently selected from the group consisting of hydrogen, chlorine, bromine, fluorine, alkyl, alkoxy and phenyl radicals and n has an average value in the range of (c) from about 0 to about 20, and an alkenyl aryl compound with a blend of (b) a dicyanate ester of a polyether of a polyphenol having the structure:

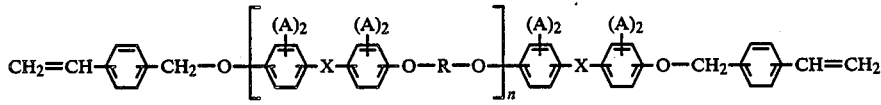

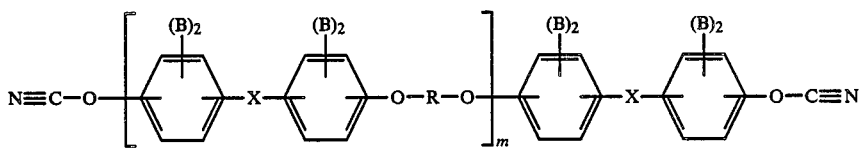

in which X is selected from the group consisting of in which X is selected from the group consisting of

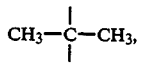

$SO_2$, O, S, and $CH_2$ radicals, R is selected from the group consisting of —$CH_2$—$C_6$—$H_4$—$CH_2$—, $(CH_2)_b$ in which b ranges from 1 to about 6, —$CH_2$—CH=CH—$CH_2$—, —$CH_2$—C≡C—$CH_2$—,

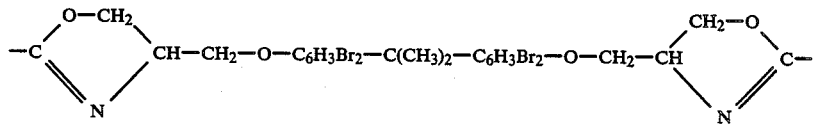

and:

radicals, B is independently selected from the group consisting of hydrogen, chlorine, bromine, fluorine, alkyl, alkoxy and phenyl radicals and m has an average value in the range of from about 0 to about 20 and (c) an alkenyl aryl compound at reaction conditions, and recovering the resultant homogeneous thermoset terpolymer.

A specific embodiment of this invention resides in a homogeneous thermoset terpolymer comprising styrenated p,p'-isopropylidenediphenol, the dicyanate ester of p,p'-isopropylidenediphenol and divinylbenzene.

Other objects and embodiments will be found in the following further detailed description of the invention.

DETAILED DESCRIPTION OF THE INVENTION

As hereinbefore set forth, the present invention is concerned with novel homogeneous thermoset terpolymers and to a method for the preparation of these terpolymers. The homogeneous thermoset terpolymers will comprise a mixture of a poly(vinyl benzyl ether) of a polyphenol, a cyanate ester of a polyether of a polyphenol, and an alkenyl aryl compound. The polymerization of these compounds will result in a terpolymer which, because of its particular structure, will be useful in electronic circuitry, inasmuch as the terpolymer will possess relatively low dielectric constants and high glass transition temperatures. In addition to these desirable characteristics, the terpolymer will also possess a low viscosity and will be 100% solids, that is, at least 99.5% of the components may react to form a cured resin matrix. These resins or varnishes which have 100% solids, or less than 0.5% non-reacting components, are excellent candidates for continuous lamination or reinforced reaction in injection molding, composite reaction injection molding or resin transfer molding applications. By possessing the 100% solids property, the polymeric composite can be processed in various ways in contrast to previous solvent-based polymers which do not possess 100% solids and therefore cannot be processed in many applications.

The poly(vinyl benzyl ether) of a polyphenol which forms one component of the terpolymer of the present invention will possess the generic structure:

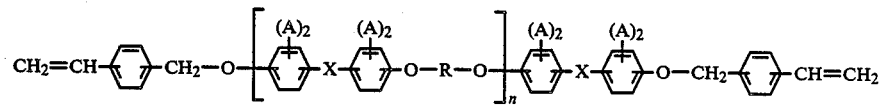

in which X is selected from the group consisting of

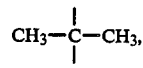

$SO_2$, O, S, and $CH_2$ radicals, R is selected from the group consisting of —$CH_2$—$C_6$—$H_4$—$CH_2$—, $(CH_2)_b$ in which b ranges from 1 to about 6, —$CH_2$—CH=CH—$CH_2$—, —$CH_2$—C≡C—$CH_2$—, —$CH_2$—$C_6H_3(A)_2$—CH(OY)—$CH_2$—CH($CH_2$OY)—$C_6H_3(A)$-2—$CH_2$—, —N=CH—O—$C_6H_5$—C($CH_3$)$_2$—$C_6H_5$—O—CH=N—, —C(NH)—O—$C_6H$—C($CH_3$)$_2$—$C_6H_5$—O—C(NH)—, —$C_6H_5$—CH(OY)—CH$_2$—CH(M)—$CH_2$—CH($CH_2$OY)—$C_6H_5$—, —CH$_2$—CH(OH)—CH$_2$—O—$C_6H_5$—C($CH_3$)$_2$—$C_6H_5$—O—CH$_2$—CH(OH)—CH$_2$—, and CH$_2$—CH(OH)—CH$_2$—O—$C_6H_3Br_2$—C($CH_3$)$_2$—$C_6H_3Br_2$—O—CH$_2$—CH(OH)—CH$_2$—, radicals, where M is a —$C_6H_5$, —$C_6H_4(CH_3)$, or —$C_6H_4(CH=CH_2)$ radical and Y is a free radical terminating compound such as hydroquinone, A is independently selected from the group consisting of hydrogen, chlorine, bromine, fluorine, alkyl, alkoxy and phenyl radicals and n has an average value in the range of from about 0 to about 20.

The second component of the terpolymer of the present invention will comprise a dicyanate ester of a polyether of a polyphenol which possesses the generic structure:

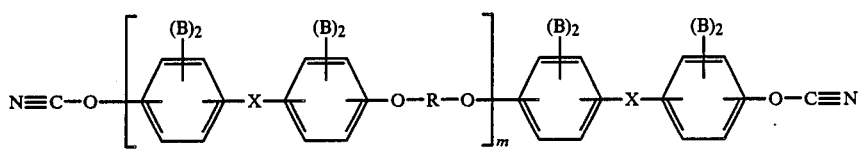

in which X is selected from the group consisting of

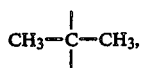

SO₂, O, S, and CH₂ radicals, R is selected from the group consisting of —CH₂—C₆—H₄—CH₂—, (CH₂)$_b$ in which b ranges from 1 to about 6, —CH₂—CH=CH—CH₂—, —CH₂—C≡C—CH₂—,

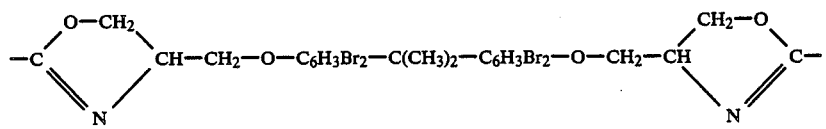

and:

radicals, B is independently selected from the group consisting of hydrogen, chlorine, bromine, fluorine, alkyl, alkoxy and phenyl radicals and m has an average value in the range of from about 0 to about 20.

The third component of the terpolymer of the present invention will comprise an alkenyl aryl compound. The term "alkenyl aryl compound" as used in the present specification and appended claims will refer to aromatic hydrocarbons containing at least one unsaturated or alkenyl substituent on the ring. These alkenyl aryl compounds will possess the generic formula:

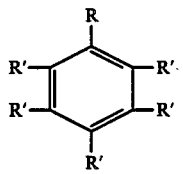

in which R is an alkenyl radical selected from the group consisting of vinyl, allyl, and methylallyl radicals and R' is independently selected from the group consisting of hydrogen, fluorine, chlorine, bromine, methyl, chloromethyl, bromomethyl, alkenyl, t-butyl, (CH₂)$_n$CH₃ in which n is an integer from 1 to 10 and phenyl radicals. Some specific examples of these alkenyl aryl compounds which may be used in the present invention will include styrene, allylbenzene, methallylbenzene, o-divinylbenzene, m-divinylbenzene, p-divinylbenzene, o-diallylbenzene, m-diallylbenzene, p-diallylbenzene, o-vinyltoluene, m-vinyltoluene, p-vinyltoluene, o-chlorostyrene, m-fluorostyrene, p-bromostyrene, o-chloromethylstyrene, p-bromomethylstyrene, p,t-butylstyrene, o-ethylstyrene, m-propylstyrene, 2-chloro-p-divinylbenzene, 2,5-dibromo-p-divinylbenzene, etc. or blends of these.

It is to be understood that the aforementioned list of components of the terpolymers of the present invention including the poly(vinyl benzyl ether) of a polyphenol, cyanate ester of the polyether of a polyphenol, and alkenyl aryl compounds are only representative of the type of compounds which may be employed, and that the present invention is not necessarily limited thereto. Also, phenolic antioxidants such as 2,6-di-tert-butyl-4-methylphenol or ultraviolet light stabilizers such as 2-hydroxy 10-benzophenone may be added to the varnish.

The novel homogeneous thermoset terpolymers of the present invention may be prepared in any suitable manner of operation which is known in the art. For example, one method of preparing the terpolymer is to blend the poly(vinyl benzyl ether) of a polyphenol with an alkenyl aryl compound and also to blend a free radical initiator such as benzoyl peroxide with the alkenyl aryl compound and also to blend a cyanate ester of a polyether of a polyphenol with the alkenyl aryl compound where these three solutions are then blended to form a homogeneous pourable solution at ambient temperature, said blending being effected at a temperature in the range of from about 50° C. to about 150° C. If so desired, other free radical initiators may be utilized to initiate the varnish reaction; for example, such other peroxides which may be used will include methyl ethyl ketone peroxide, t-butyl-peroctoate, t-amylperoctoate, dicumylperoxide, 1,1-bis(t-butylperoxy)-3,3,5-trimethylcyclohexane, etc. The homogeneous solution which is fluid at ambient temperature may then be poured onto a cloth reinforcement or injected into a mold containing a cloth reinforcement by various processes including composite reaction injection molding, reinforced reaction injection molding, or resin transfer molding, and cured at an elevated temperature in the range of from about 80° C. to about the boiling point of the alkenyl aryl compound for a period of time which may range from about 0.002 to about 1 hour. The cloth reinforcement may have coated or uncoated treated copper foil on both sides with a hole in one foil for solution to flow to reinforcement. Thereafter, the treated reinforcement may then be transferred to a separate cooling press, following which it may be post-cured at a temperature ranging from about 150° C. to about 220° C. for a period of time which may range from about 1 to about 12 hours in duration. The processes may also involve having copper-plated caul plates inserted into the mold cavity; said copper plating having been treated with another metal and/or may be coated with a varnish which may be partially or fully cured after the coating. Alternatively, the caul plates may also be coated with partially or fully cured varnish containing metallic particles such as palladium-tin or an intermediate carrier may be coated with the filled varnish which would then be placed on the caul plate prior to varnish injection. The filled coating may, if so desired, take the place of the plated copper. At least one of the caul plates which are used may contain at least one hole near the center thereof to permit the solution to flow to the reinforcement. If so desired, the caul plates may have three dimensional configurations which will produce non-planar or irregularly shaped thermoset laminates. Also, the caul plates may have a resist applied and developed so that a circuit pattern which is formed on the caul plate may be transferred to the part during the reaction molding. Likewise, a thermoset laminate which flush circuitry may be prepared if the resist is stripped off before reaction molding is effected.

It is also contemplated within the scope of this invention that the homogeneous solution may also be blended with particulate fillers and may then be poured into a mold or utilized in various other ways such as incapsulating a chip of forming a chip carrier or coating metal foils.

It is also contemplated within the scope of this invention that the homogeneous thermoset terpolymers may be prepared in a continuous manner of operation. When this type of operating is employed, the predetermined amounts of the poly(vinyl benzyl ether) of a polyphenol which has been dissolved in the alkenyl aryl compound and the alkenyl aryl compound in which the cyanate ester has been added along with the free radical initiator such as benzoyl peroxide, are continuously charged either separately or in a premixed state to a zone which is maintained at the proper operating conditions of temperature and pressure. An advantageous property of the varnishes or terpolymers of the present invention is that the terpolymers may be utilized to saturate a reinforcement such as glass cloth, etc. at ambient temperature without the necessity for adding a solvent which must be removed in a subsequent operation. Those skilled in the art will recognize that a continuous reactant charge is necessary, with amounts depending upon the individual components, to provide a high yield of product which contains the desired percentage of each component in the finished homogeneous thermoset terpolymers. After passage through this zone, the mixture resulting therefrom may be continuously withdrawn and utilized to coat and/or impregnate a substrate or reinforcement. The coated or impregnated substrate or reinforcement may thereafter be continuously charged to a curing zone where it is subjected to a partial cure by passage through this zone which is maintained at varying operating temperatures for a predetermined period of time. After passage through the zone, the resulting prepreg material is continuously withdrawn and passed to storage. The prepreg can then be layed up as sheets with or without a metal such as copper foil as an electrical or thermal conductor, and pressed in a predetermined number of sheets to form the desired laminate or circuit board matrix.

A solventless continuous lamination process may also be utilized to process clad or unclad laminates using the thermoset terpolymer in which one or more polymer saturated reinforcing cloths, which may not be B-staged, may be cured in a continuous belt-press between metal foil layers, between release films, belts coated with release, or belts which are made of a release material.

Regardless of the method which is utilized to form the desired homogeneous thermoset terpolymer, it is contemplated that the three components of the final composition of matter may be present in various weight ratios so as to provide the necessary characteristics which are required to meet specific circuit board requirements. In the preferred embodiment of the invention, the poly(vinyl benzyl ether) of a polyphenol will be present in the finished composite in an amount in the range of from about 30% to about 50% by weight of the finished composite, the alkenyl aryl compound will be present in an amount in the range of from about 30% to about 50% by weight of the composite and the cyanate ester of a polyether of a polyphenol will be present in an amount in the range of from about 15% to about 20% by weight of the composite. For example, the brittleness of the polymer may be controlled by varying the amount of the cyanate ester of a polyether of a polyphenol or poly(vinyl benzyl ether) of a polyphenol. Likewise, by varying the weight percentages of other components, it is also possible to alter and control the viscosity. This is of importance in obtaining a polymer with 100% solids inasmuch as the presence of a volatile solvent may lead to emmission control problems or entrapped volatile problems during the processing of the laminate.

While the above weight ratios constitute a preferred embodiment, it is also contemplated within the scope of this invention that the three components of the homogeneous thermoset terpolymers may be present in the finished composite in either a greater or lesser amount, depending upon the particular properties which are desired to be possessed by the finished composite, and that the present invention is not limited to these ratios.

In addition to the aforementioned favorable characteristics which are possessed by the homogeneous thermoset terpolymers of the present invention, another advantage in utilizing these terpolymers as components of a laminate is when employing a halogenated derivative of a poly(vinyl benzyl ether) of a polyphenol or a cyanate ester of a polyether of a polyphenol as a component of the terpolymer. The presence of these halogenated derivatives, and especially the brominated or chlorinated derivative, will introduce a desired property enhancement to a substrate or reinforcement in that the laminate may then meet certain flammability requirements such as UL 94 flammability tests.

The following examples are given for purposes of illustrating the novel homogeneous thermoset terpolymers of the present invention which possess the aforementioned desirable properties and to a method for the preparation thereof. However, it is to be understood that these examples are given merely for purposes of illustration and that the present invention is not necessarily limited thereto.

EXAMPLE I

To form a homogeneous thermoset terpolymer, 18 grams of styrenated tetrabromosubstituted p,p'-isopropylidenediphenol and 10 grams of divinylbenzene were blended and heated to a temperature of 65° C. for a period of 20 minutes with mixing to dissolve the diphenol. A second solution was prepared by blending 6 grams of the dicyanate ester of p,p'-isopropylidenediphenol and 5 grams of divinylbenzene with mixing at a temperature of 121° C. until the dicyanate ester dissolved. The two solutions were blended at a temperature of 65° C. Following this, 1.2 grams of 1,1-bis(t-butylperoxy)3,3,5-trimethylcyclohexane was mixed with 5 grams of divinylbenzene at room temperature, and the resulting solution blended with the previous two solutions. The peroxide which was used in this example was liquid at room temperature so that it was added without prior dissolution in divinylbenzene. (If so desired, a solid peroxide such as benzoyl peroxide, which has been dissolved in a solvent such as divinylbenzene heated to a temperature of 65° C. prior to addition, may also be used). The resulting polymer was stable for a period of 64 hours before a slight amount of precipitate was noticed; however, reheating the polymer to 65° C. for a period of 15 minutes redissolved the precipitate. The viscosity of the terpolymer or varnish was 31 cp at room temperature.

To form a laminate, a portion of the terpolymer may be poured onto the treatment side of a 1 oz. per square foot treated copper foil and cured for a period of 20 minutes at a temperature of 135° C. as was effected for other samples of this type. However, for the laminate preparation in this example, untreated copper was used. Following this, vinyl silane-treated glass cloth was placed on top of the upturned roughest treatment side of the copper. The E-glass cloth was then saturated with the polymer and additional cloth layers were added, each glass cloth layer being saturated with the polymer as it was placed on the stack. The stack was then topped with copper foil, the roughest treatment side down. The stack was then cured in a press for a period of one hour at a temperature of 140° C. followed by one hour at 178° C. to form a laminate. The resulting laminate was then post-baked for a period of 16 hours at a temperature of 177° C. and for a period of 0.5 hours at a temperature of 205° C. Analysis of the laminate showed two glass transition temperatures ($T_g$) of 269° C. and 356° C. where the major decrease in modulus occured at 340° C., a dielectric constant of 3.61 and a dissipation factor of 0.005 for a sample containing a resin content of 37.3% tested at 1 MHz. In addition, the peel strength of the copper foil was 3.6 lbs per inch. When a repeat of this experiment was performed utilizing vinyltoluene in place of divinylbenzene, the resulting laminate possessed a peel strength of 7.4 lbs per inch.

EXAMPLE II

In this example, the laminates which were prepared were formulated to evaluate prepreg B-staging in contrast to the laminate prepared in Example I above which did not undergo prepreg B-staging. A first set of three solutions were prepared by dissolving 18 g of styrenated tetrabrominated p,p'-isopropylidenediphenol in 9 g of divinylbenzene at a temperature of 66° C. A second set of solutions was prepared by dissolving 8 g of the dicyanate ester of p,p'-isopropylidenediphenol in 8 g of divinylbenzene at a temperature of 121° C. To prepare Formulation A, 1.0 g of 1,1-bis(t-butylperoxy)3,3,5-trimethylcyclohexane was added to one of each of the first and second solutions. To prepare Formulation B, 0.1 g of zinc octoate solution was added to one of each of the first and second solutions while Formulation C contained the same amount of both of the cyclohexane and zinc octoate in the same concentration in one of each of the first and second solutions. Three samples of E-glass cloth were impregnated with the three polymer formulations and baked in an air-circulating oven at a temperature of 121° C. Formulation A was B-staged for 40 seconds at 121° C. giving a material with a resin content of 45% and an 18.9% flow. Formulation B was B-staged for 90 seconds at a temperature of 121° C. to yield a material having a resin content of 46.8% and a 19.2% flow. Formulation C was B-staged for a period of 40 seconds at 121° C. giving a material which possessed a resin content of 45.8% and an 18.8% flow. The flow tests were performed on 4 plies of 2×2" samples at a pressure of 210 psi and a temperature of 150° C. Formulations A & B in the B-stage were pressed into a copper clad laminate. The copper foil which was used on one side of these laminates was coated with Formulations A or B and cured for a period of 10 minutes at 121° C. Uncoated polymer treated copper foil was used on the other side of each sample. Eight plies of E-glass prepreg were placed between a coated and an uncoated copper foil, following which the stack was pressed at a pressure of 45 psi for a period of 1 hour at a temperature of 150° C., following which it was pressed for a period of 1 hour at 177° C. The laminate prepared utilizing Formulation A had a peel strength of 5.6 lbs. per square inch, a dielectric constant of 4.06 for a 40.95% retained resin laminate at 1 MHz, a dissipation factor of 0.008 and a glass transition temperature (Tg) of 268° C. The laminate which was prepared from Formulation B had a peel strength of 8.0 lbs. per square inch, a dielectric constant of 3.95 for a 43.67% retained resin laminate at 1 MHz, a dissipation factor of 0.008 and a glass transition temperature (Tg) of 293° C.

EXAMPLE III

In this example, equal parts of styrenated bisphenol A and divinylbenzene were blended at a temperature of 65° C. for a period of 20 minutes. A second solution was prepared by admixing divinylbenzene and the dicyanate ester of tetrabromo bisphenol A at a temperature of 95° C. The solutions were then blended at a temperature of 65° C. to form the desired homogeneous thermoset terpolymer. This terpolymer may then be used to saturate a substrate such as glass cloth in various plies, the plies being topped with copper foil and the stack then cured in a manner similar to that set forth in Example I above.

EXAMPLE IV

In a similar manner, other terpolymers may be prepared by forming a solution of equal amounts of styrenated tetramethylsubstituted bisphenol A and styrene, thereafter blending this solution with a second solution of the dicyanate ester of bisphenol A and styrene at an elevated temperature. The terpolymer may then be used to saturate or impregnate a substrate such as Kevlar which may then be topped with copper foil and pressed to form a desired laminate.

Other homogeneous thermoset terpolymers may also be prepared by forming a solution of styrenated bisphenol A and divinylbenzene, admixing this blend with a blend of dicyanate ester of bisphenol A and divinylbenzene, all blendings being performed at an elevated temperature of about 65° C. to form the desired terpolymer. Following this, the terpolymer may then be used to impregnate a substrate in a manner similar to that hereinbefore set forth; the impregnated substrate may then be utilized in a predetermined number of plies to form a laminate containing a conductive metal such as copper on both sides of the laminate.

We claim as our invention:

1. Homogeneous thermost terpolymers comprising the polymeric reaction product of (a) about 30% to about 50% by weight of a poly(vinyl benzyl ether) of a polyphenol having the structure:

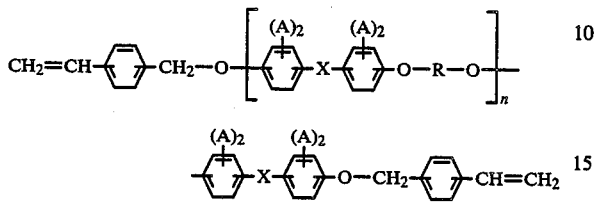

in which X is selected from the group consisting of

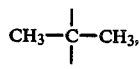

—SO$_2$—, —O—, —S—, and —CH$_2$— radicals, R is selected from the group consisting of —CH$_2$—C$_6$H$_4$—CH$_2$—, —CH$_2$)$_b$ in which b ranges from 1 to about 6, —CH$_2$—CH=CH—CH$_2$—, —CH$_2$C≡C—CH$_2$—, —CH$_2$—C$_6$H$_3$(A)$_2$—CH(OY)—CH$_2$—CH(CH$_2$OY)—C$_6$H$_3$(A)$_2$—CH$_2$—, —N=CH—O—C$_6$H$_5$—C(CH$_3$)$_2$—C$_6$H$_5$—O—CH=N—, —C(NH)—O—C$_6$H$_5$—C(CH$_3$)$_2$—C$_6$H$_5$—O—C(NH)—, —C$_6$H$_5$—CH(OY)—CH$_2$—CH(M)—CH$_2$—CH(CH$_2$OY)—C$_6$H$_5$—, —CH$_2$—CH(OH)—CH$_2$—O—C$_6$H$_5$—C(CH$_3$)$_2$—C$_6$H$_5$—O—CH$_2$—CH(OH)—CH$_2$—, and —CH$_2$—CH(OH)—CH$_2$—O—C$_6$H$_3$Br$_2$—C(CH$_3$)$_2$—C$_6$H$_3$Br$_2$—O—CH$_2$—CH(OH)—CH$_2$—, radicals, where M is a —C$_6$H$_5$, —C$_6$H$_4$—CH$_3$), or C$_6$H$_4$—CH=CH$_2$) and Y is —C$_6$H$_4$—OH, A is independently selected from the group consisting of hydrogen, chlorine, bromine, fluorine, alkyl, alkoxy and phenyl radicals and n has an average value in the range of from about 0 to abut 20 and (b) about 15% to about 20% by weight of a dicyanate ester of a polyether of a polyphenol having the structure:

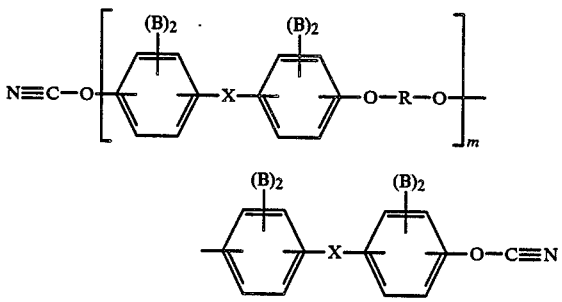

in which X is selected from the group consisting of

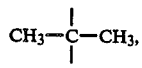

—SO$_2$—, —O—, —S—, and —CH$_2$— radicals, R is selected from the group consisting of —CH$_2$—C$_6$H$_4$—CH$_2$—, —CH$_2$)$_b$ in which b ranges from 1 to about 6, —CH$_2$—CH=CH—CH$_2$—, —CH$_2$—C≡C—CH$_2$—,

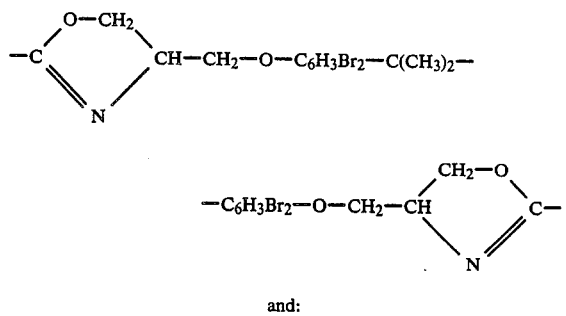

and:

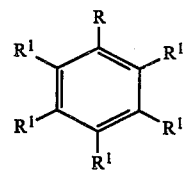

radicals, B is independently selected from the group consisting of hydrogen, chlorine, bromine, fluorine, alkyl, alkoxy and phenyl radicals and m has an average value in the range of from about 0 to about 20 and (c) 30% to about 50% by weight of an alkenyl aryl compound having the structure:

[structure with R, R$^1$ substituents on benzene ring]

in which R is an alkenyl radical selected from the group consisting of vinyl, allyl, and methyl allyl radicals and R$^1$ is independently selected from the group consisting of hydrogen, fluorine, chlorine, bromine, methyl, chloromethyl, bromomethyl, alkenyl, t-butyl, —CH$_2$)$_n$CH$_3$ in which n is an integer from 1 to 10 and phenyl radicals.

2. The homogeneous thermoset terpolymer as set forth in claim 1 in which A is hydrogen.

3. The homogeneous thermoset terpolymer as set forth in claim 1 in which A is bromine.

4. The homogeneous thermoset terpolymer as set forth in claim 1 in which A is methyl.

5. The homogeneous thermoset terpolymer as set forth in claim 1 in which B is hydrogen.

6. The homogeneous thermoset terpolymer as set forth in claim 1 in which B is bromine.

7. The homogeneous thermoset terpolymer as set forth in claim 1 in which B is methyl.

8. The homogeneous thermoset terpolymer as set forth in claim 1 in which said alkenyl aryl compound is divinylbenzene.

9. The homogeneous thermoset terpolymer as set forth in claim 1 in which said alkenyl aryl compound is styrene.

10. The homogeneous thermoset terpolymer as set forth in claim 1 in which said alkenyl aryl compound is vinyltoluene.

11. The homogeneous thermoset terpolymer as set forth in claim 1 in which said poly(vinyl benzyl ether) of a polyphenol is a poly(vinyl benzyl ether) of p,p'-isopropylidenediphenol, said dicyanate ester of a polyether of a polyphenol is the dicyanate ester of polyether of p,p′-isopropylidenediphenol and said alkenyl aryl compound is divinylbenzene.

12. The homogeneous thermoset terpolymer as set forth in claim 1 in which said poly(vinyl benzyl ether) of a polyphenol is styrenated tetrabromosubstituted p,p′-isopropylidenediphenol, the dicyanate ester of a polyether of a polyphenol is the dicyanate ester of p,p′-isopropylidenediphenol and said alkenyl aryl compound is divinylbenzene.

13. The homogeneous thermoset terpolymer as set forth in claim 1 in which said poly(vinyl benzyl ether) of a polyphenol is a poly(vinyl benzyl ether) of tetrabromosubstituted p,p′-isopropylidenediphenol, the dicyanate ester of a polyether of a polyphenol is the dicyanate ester of a polyether of tetrabromosubstituted p,p′-isopropylidenediphenol and said alkenyl aryl compound is divinylbenzene.

14. The homogeneous thermoset terpolymer as set forth in claim 1 in which said poly(vinyl benzyl ether) of a polyphenol is a poly(vinyl benzyl ether) of p,p′-isopropylidenediphenol, said dicyanate ester of a polyether of a polyphenol is the dicyanate ester of a polyether of p,p′-isopropylidenediphenol and said alkenyl aryl compound is vinyltoluene.

15. The homogeneous thermoset terpolymer as set forth in claim 1 in which said poly(vinyl benzyl ether) of a polyphenol is a poly(vinyl benzyl ether) of tetrabromosubstituted p,p′-isopropylidenediphenol, the dicyanate ester of a polyether of a polyphenol is the dicyanate ester of a polyether of p,p′-isopropylidenediphenol and said alkenyl aryl compound is vinyltoluene.

16. A process for the production of a homogeneous thermoset terpolymer which comprises reacting a blend of (a) poly(vinyl benzyl ether) of a polyphenol having the structure:

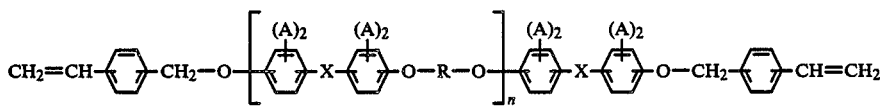

in which X is selected from the group consisting of

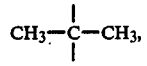

—SO$_2$—, —O—, —S—, CH$_2$ radicals, R is selected from the group consisting of —CH$_2$—C$_6$H$_4$—CH$_2$—, —CH$_2$)$_b$ in which b ranges from 1 to about 6, —CH$_2$—CH=CH—CH$_2$—, —CH$_2$—C≡C—CH$_2$—,

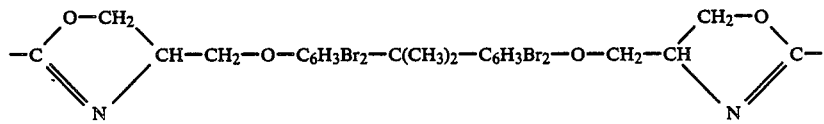

and:

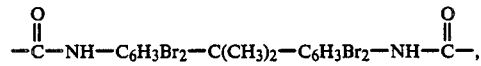

radicals, B is independently selected from the group consisting of hydrogen, chlorine, bromine, fluorine,

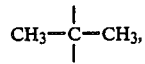

—SO$_2$—, —O—, —S—, and —CH$_2$— radicals, R is selected from the group consisting of —CH$_2$—C$_6$H$_4$—CH$_2$—, —CH$_2$)$_b$ in which b ranges from 1 to about 6, —CH$_2$—CH=CH—CH$_2$—, —CH$_2$—C≡C—CH$_2$—, —CH$_2$—C$_6$H$_3$(A)$_2$—CH(OY)—CH$_2$—CH(CH$_2$OY)—C$_6$H$_3$(A)$_2$—CH$_2$—, —N=CH—O—C$_6$H$_5$—C(CH$_3$)$_2$—C$_6$H$_5$—O—CH=N—, —C(NH)—O—C$_6$H$_5$—C(CH$_3$)$_2$—C$_6$H$_5$—O—C(NH)—, —C$_6$H$_5$—CH(OY)—CH$_2$—CH(M)—CH$_2$—CH(CH$_2$OY)—C$_6$H$_5$—, —CH$_2$—CH(OH)—CH$_2$—O—C$_6$H$_5$—C(CH$_3$)$_2$—C$_6$H$_5$—O—CH$_2$—CH(OH)—CH$_2$—, and —CH$_2$—CH(OH)—CH$_2$—O—C$_6$H$_3$Br$_3$—C(CH$_3$)$_2$—C$_6$H$_3$Br$_2$—O—CH$_2$—CH(OH)—CH$_2$—, radicals, where M is a —C$_6$H$_5$, —C$_6$H$_4$—CH$_3$), or C$_6$H$_4$—CH=CH$_2$) and Y is —C$_6$H$_4$—OH, A is independently selected from the group consisting of hydrogen, chlorine, bromine, fluorine, alkyl, alkoxy and phenyl radicals and n has an average value in the range of from about 0 to about 20, and (c) an alkenyl aryl compound with a blend of (b) a dicyanate ester of a polyether of a polyphenol having the structure:

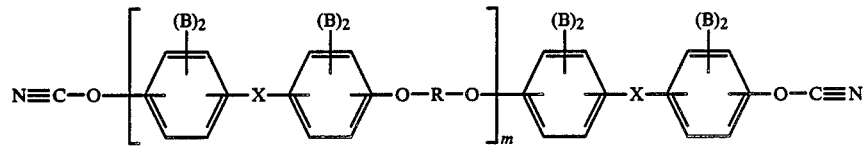

in which X is selected from the group consisting of alkyl, alkoxy and phenyl radicals and m has an average value in the range of from about 0 to about 20 and (c) an alkenyl aryl compound having the structure:

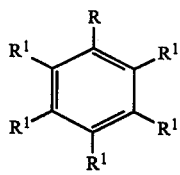

in which R is an alkenyl radical selected from the group consisting of vinyl, allyl, and methyl allyl radicals and $R^1$ is independently selected from the group consisting of hydrogen, fluorine, chlorine, bromine, methyl, chloromethyl, bromomethyl, alkenyl, t-butyl, —$(CH_2)_nCH_3$ in which n is an integer from 1 to 10 and phenyl radicals at reaction conditions, and recovering the resultant homogeneous thermoset terpolymer (a) being about 30% to about 50% by weight, (b) being about 15% to about 20% by weight, and (c) being about 30% to about 50% by weight of said terpolymer.

17. The process as set forth in claim 16 in which said reaction conditions include a temperature in the range of from about 50° C. to about 150° C. and a pressure in the range of from about atmospheric to about 50 atmospheres.

18. The process as set forth in claim 16 further characterized in that said reaction is effected in the presence of a free radical initiator.

19. The process as set forth in claim 16 in which said free radical initiator is 1,1-bis(t-butylperoxy)-3,3,5-trimethylcyclolhexane.

20. The process as set forth in claim 16 in which said poly(vinyl benzyl ether) of a polyphenol is a poly(vinyl benzyl ether) of p,p'-isopropylidenediphenol, said dicyanate ester of a polyether of a polyphenol is the dicyanate ester of a polyether of p,p'-isopropylidenediphenol and said alkenyl aryl compound is divinylbenzene.

21. The process as set forth in claim 16 in which said poly(vinyl benzyl ether) of a polyphenol is a poly(vinyl benzyl ether) of tetrabromosubstituted p,p'-isopropylidenediphenol, the dicyanate ester of a polyether of a polyphenol is the dicyanate ester of polyether of p,p'-isopropylidenediphenol and said alkenyl aryl compound is divinylbenzene.

22. The process as set forth in claim 16 in which said poly(vinyl benzyl ether) of a polyphenol is a poly(vinyl benzyl ether) of tetrabromosubstituted p,p'-isopropylidenediphenol, the dicyanate ester of a polyether of a polyphenol is the dicyanate ester of a polyether of tetrabromosubstituted p,p'-isopropylidenediphenol and said alkenyl aryl compound is divinylbenzene.

23. The process as set forth in claim 16 in which said poly(vinyl benzyl ether) of a polyphenol is a poly(vinyl benzyl ether) of p,p'-isopropylidenediphenol, said dicyanate ester of a polyether of a polyphenol is the dicyanate ester of p,p'-isopropylidenediphenol and said alkenyl aryl compound is vinyltoluene.

24. The process as set forth in claim 16 in which said poly(vinyl benzyl ether) of a polyphenol is a poly(vinyl benzyl ether) of tetrabromosubstituted p,p'-isopropylidenediphenol, the dicyanate ester of a polyether of a polyphenol is the dicyanate ester of a polyether of p,p'-isopropylidenediphenol and said alkenyl aryl compound is vinyltoluene.

* * * * *